United States Patent
Allen et al.

(10) Patent No.: US 9,087,879 B2
(45) Date of Patent: Jul. 21, 2015

(54) METHOD OF MAKING SEMICONDUCTOR DEVICE WITH DISTINCT MULTIPLE-PATTERNED CONDUCTIVE TRACKS ON A SAME LEVEL

(71) Applicant: International Business Machines Corporation, Armonk, NY (US)

(72) Inventors: David H. Allen, Rochester, MN (US); Douglas M. Dewanz, Rochester, MN (US); David P. Paulsen, Dodge Center, MN (US); John E. Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/268,606

(22) Filed: May 2, 2014

(65) Prior Publication Data

US 2015/0011023 A1    Jan. 8, 2015

Related U.S. Application Data

(63) Continuation of application No. 13/933,488, filed on Jul. 2, 2013.

(51) Int. Cl.

| | | |
|---|---|---|
| *H01L 21/768* | (2006.01) | |
| *H01L 21/66* | (2006.01) | |
| *H01L 23/48* | (2006.01) | |
| *H01L 23/528* | (2006.01) | |

(52) U.S. Cl.
CPC .......... *H01L 21/76838* (2013.01); *H01L 22/12* (2013.01); *H01L 22/20* (2013.01); *H01L 22/26* (2013.01); *H01L 23/48* (2013.01); *H01L 23/5286* (2013.01)

(58) Field of Classification Search
CPC .............. H01L 21/76838; H01L 23/48; H01L 23/5286
See application file for complete search history.

(56) References Cited

U.S. PATENT DOCUMENTS

| | | | |
|---|---|---|---|
| 4,308,090 A | 12/1981 | Te Velde et al. | |
| 5,472,814 A * | 12/1995 | Lin | 430/5 |
| 5,561,317 A | 10/1996 | Momma et al. | |
| 5,841,664 A | 11/1998 | Cai et al. | |
| 5,888,676 A | 3/1999 | Saitoh | |
| 6,175,138 B1 | 1/2001 | Noda | |
| 6,496,035 B2 | 12/2002 | Jensen et al. | |

(Continued)

FOREIGN PATENT DOCUMENTS

JP    2002151592 A    5/2002

OTHER PUBLICATIONS

Allen et al., "Signal Path of a Multipe-Patterned Semiconductor Device," filed Jan. 2, 2013, U.S. Appl. No. 13/732,525.

(Continued)

*Primary Examiner* — Thanh V Pham
(74) *Attorney, Agent, or Firm* — Wood, Herron & Evans, LLP; Robert R. Williams

(57) ABSTRACT

A multiple-patterned semiconductor device and a method of manufacture are provided. The semiconductor device includes a conductive layer. The conductive layer includes conductive tracks which may be defined by photomasks. The conductive tracks may have quality characteristics. Distinct quality characteristics of distinct conductive tracks may be compared. Based on the comparison, signals and supply voltage may be routed on particular conductive tracks.

7 Claims, 12 Drawing Sheets

(56) References Cited

U.S. PATENT DOCUMENTS

| | | |
|---|---|---|
| 6,611,944 B2 | 8/2003 | Elzinga |
| 6,841,465 B2 | 1/2005 | Choi |
| 6,866,971 B2 * | 3/2005 | Pierrat .............................. 430/5 |
| 7,047,514 B2 | 5/2006 | Mizuno et al. |
| 7,139,152 B2 | 11/2006 | Mahnad et al. |
| 7,216,314 B2 | 5/2007 | Decloedt |
| 7,239,174 B2 | 7/2007 | Madurawe |
| 7,323,717 B2 | 1/2008 | Koyama et al. |
| 7,334,208 B1 | 2/2008 | Cox |
| 7,523,436 B2 | 4/2009 | Mizuno et al. |
| 7,739,624 B2 | 6/2010 | McElvain et al. |
| 7,781,149 B2 | 8/2010 | Paxton et al. |
| 7,861,196 B2 | 12/2010 | Huckabay et al. |
| 8,236,663 B2 | 8/2012 | Coolbaugh et al. |
| 8,386,979 B2 | 2/2013 | McElvain et al. |
| 8,448,120 B2 | 5/2013 | Huang et al. |
| 8,468,484 B2 | 6/2013 | Lilja |
| 8,475,872 B2 | 7/2013 | Kang et al. |
| 8,531,203 B2 | 9/2013 | Christensen et al. |
| 8,533,641 B2 | 9/2013 | Park et al. |
| 8,558,286 B2 | 10/2013 | Tian et al. |
| 8,560,998 B1 | 10/2013 | Salowe et al. |
| 8,572,522 B2 | 10/2013 | Iwase et al. |
| 8,578,304 B1 | 11/2013 | Behrends et al. |
| 8,601,411 B2 | 12/2013 | Chen et al. |
| 8,703,574 B2 | 4/2014 | Gaynor et al. |
| 8,709,684 B2 | 4/2014 | Chern et al. |
| 2008/0192164 A1 | 8/2008 | Jung et al. |
| 2009/0283903 A1 | 11/2009 | Park |
| 2010/0199253 A1 | 8/2010 | Cheng et al. |
| 2010/0202206 A1 * | 8/2010 | Seol et al. ................ 365/185.17 |
| 2011/0006998 A1 | 1/2011 | Kang et al. |
| 2011/0014786 A1 | 1/2011 | Sezginer et al. |
| 2011/0207328 A1 | 8/2011 | Speakman |
| 2012/0025403 A1 | 2/2012 | Yokogawa |
| 2012/0119304 A1 | 5/2012 | Sugimae et al. |
| 2012/0151430 A1 | 6/2012 | Emmanuel et al. |
| 2012/0193814 A1 | 8/2012 | Dunne et al. |
| 2013/0032885 A1 | 2/2013 | Swamynathan et al. |
| 2013/0149638 A1 | 6/2013 | Ogadhoh et al. |
| 2013/0154128 A1 | 6/2013 | Wang et al. |
| 2013/0175631 A1 | 7/2013 | Behrends et al. |
| 2013/0244427 A1 | 9/2013 | Yuan et al. |
| 2013/0263065 A1 | 10/2013 | Chen et al. |
| 2013/0295727 A1 | 11/2013 | Hsu et al. |

OTHER PUBLICATIONS

Allen et al., "Signal Path of a Multipe-Patterned Semiconductor Device," filed Mar. 7, 2013, U.S. Appl. No. 13/787,948.

Allen et al., "Signal Path and Method of Manufacturing a Multiple-Patterned Semiconductur Device," filed Jan. 2, 2013, U.S. Appl. No. 13/732,721.

Allen et al., "Signal Path and Method of Manufacturing a Multiple-Patterned Semiconductur Device," filed Mar. 7, 2013, U.S. Appl. No. 13/788,049.

Allen et al., "Signal Path and Method of Manufacturing a Multiple-Patterned Semiconductur Device," filed Mar. 7, 2013, U.S. Appl. No. 13/788,194.

Allen et al., "Semiconductor Device Channels," filed Mar. 12, 2013, U.S. Appl. No. 13/795,386.

Allen et al., "Semiconductor Device Channels," filed Mar. 12, 2013, U.S. Appl. No. 13/795,721.

Allen et al., "Multiple-Patterned Semiconductor Device Channels," filed Mar. 12, 2013, U.S. Appl. No. 13/795,890.

Allen et al., "Semiconductor Device Channels," filed Mar. 15, 2013, U.S. Appl. No. 13/835,429.

Allen et al., "Semiconductor Device Channels," filed Mar. 15, 2013, U.S. Appl. No. 13/835,826.

Allen et al., "Multiple-Patterned Semiconductor Device Channels," filed Mar. 15, 2013, U.S. Appl. No. 13/836,335.

Allen et al., "Multiple-Patterned Semiconductor Device", filed Jul. 2, 2013. U.S. Appl. No. 13/933,488.

Mack, C., "Semiconductor Lithography", Chris Mack, Gentleman Scientist, pp. 1-12. http://www.lithoguru.com/scientist/lithobasics.html.

* cited by examiner

711 First Mask

722 Second Mask

703 Photoresist Layer Pre-exposure

702 Interlayer Insulating Film Layer Pre-etch

701 Semiconductor Substrate Layer

METHOD OF MAKING SEMICONDUCTOR DEVICE WITH DISTINCT MULTIPLE-PATTERNED CONDUCTIVE TRACKS ON A SAME LEVEL

TECHNICAL FIELD

This disclosure relates generally to a semiconductor device and method of manufacture and, more particularly, relates to a multiple-patterned semiconductor device.

BACKGROUND

The semiconductor industry is producing more and more capable components with smaller and smaller feature sizes. Due to the increased demand for highly integrated semiconductor devices, advanced techniques of fabricating more semiconductor devices in a smaller die area have become strongly relied upon. The production of such semiconductor devices reveals new design and manufacturing challenges to be addressed in order to maintain or improve semiconductor device performance.

SUMMARY

Aspects of the disclosure include a multiple-patterned semiconductor device and a method of manufacture. The semiconductor device may include a conductive layer. The conductive layer may include conductive tracks which may be defined by photomasks. The conductive tracks may have quality characteristics. Distinct quality characteristics of distinct conductive tracks may be compared. Based on the comparison, signals and supply voltage may be routed on particular conductive tracks.

Aspects of the disclosure may include the conductive layer being double-patterned. The conductive layer may conduct a signal or receive a supply voltage. In embodiments, more conductive layers may exist. Photolithography steps may involve separate masks including a first mask and a second mask. Adjacent wire channels may be defined with such separate masks in separate lithography steps. In embodiments, a connection structure may exist. In embodiments, a repowering block may exist. In embodiments, the connection structure may include the repowering block. In embodiments, a voltage supply grid or a voltage supply track group may exist. In embodiments, the connection structure may include the voltage supply grid or the voltage supply track group.

DETAILED DESCRIPTION

Figure 1:
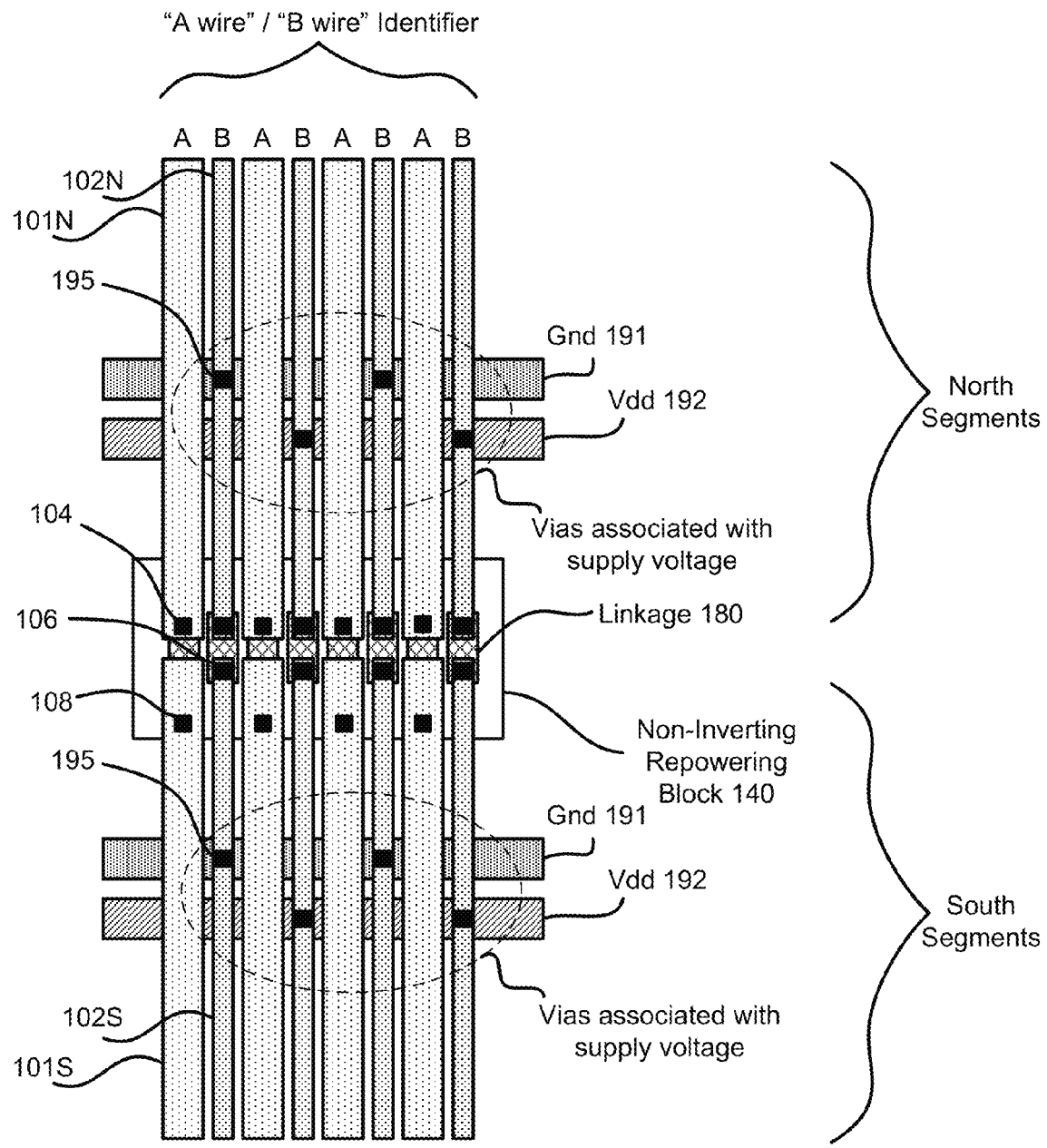
FIG. 1 is a planar view showing a portion of a double-patterned semiconductor device having a non-inverting repowering block and linkages according to embodiments.

Including shield wires on semiconductor devices such as high-speed buses is a design technique to limit coupling at a cost of increased routing area. Using supply voltage (e.g., Vdd, Gnd) as shielding on certain wires may limit or deter coupling, including for closely spaced wires. In a double-patterned semiconductor device, where wires may be closely spaced, routing signals on wider wires while connecting shielding to narrower wires may positively impact performance.

As the device density of semiconductors increases, the conductor line width and spacing within the semiconductor devices decreases. Multiple-pattern lithography represents a class of technologies developed for photolithography to enhance the feature density of semiconductor devices. Double-patterning, a subset of multiple-patterning, may be used as early as the 45 nm node in the semiconductor industry and may be the primary technique for the 32 nm node and beyond. Double-patterning employs multiple masks and photolithographic steps to create a particular layer of a semiconductor device. With benefits such as tighter pitches and narrower wires, double-patterning alters relationships between variables related to semiconductor device wiring and wire quality to sustain performance.

As conductor line width and pitch geometries decrease, the use of double-patterning on a particular layer may increase in order to achieve the required conductor dimensions while still using existing state of the art lithographic exposure equipment. A benefit of double-patterning includes the ability to form tight conductor pitches; however, double-patterning may introduce other variables related to timing and noise into the semiconductor process. Double-patterns alter relationships between adjacent wires in both width and spacing. Adjacent wire channels may be defined in separate lithography steps. Distinctions between adjacent wires may arise due to lithographic exposure variations and registration or placement errors of one exposure relative to another.

Single layer patterning enables straightforward characterization of parameters with signal delay implications such as wire width, height, and spacing variations. A product of a resistance value (R) of a wire and a capacitance value (C) of the wire forms an RC time constant for the wire (note this is an approximation since the R and the C are distributed along the wire length). Historically, a decrease in wire width or thickness brings about a resistance increase and a corresponding capacitance decrease. The C decrease approximately offsets the R increase in the RC time constant. Such capacitance decrease occurs in part due to a reduction in lateral capacitance because the space between wires increases as wire width decreases. Similarly, an increase in wire width or thickness brings about a resistance decrease approximately offset in the RC time constant by a corresponding capacitance increase. Such a capacitance increase occurs in part due to a rise in lateral capacitance because the space between wires decreases as wire width increases. Thus, in single-patterning the RC time constant remains within appropriate limits of tolerance.

Double-patterning prompts a different nature of lateral capacitance relative to single layer patterning. In double-patterning, the width of adjacent wires is rather independent, i.e., track poorly. Wire widths may not track well between adjacent wires created using separate exposures. Relatively narrow wires may be next to or between relatively wide wires. Double-patterning creates varying lateral capacitance between adjacent wires effectively separate from wire resistance variations. The resistance value (R) and the capacitance value (C) may fail to counterbalance each other across process variations. For example, a highly resistive wire may have high R and high C. Thus, the RC time constant between adjacent wires may vary significantly. Early analysis of a particular 14-15 nm technology indicates a potential doubling of worst case lateral capacitance between adjacent wires, doubling of coupled noise, and increased total wire C by as much as 50%. Such variations may call for a solution to mitigate these effects. For instance, providing shielding to noise sensitive signal-carrying wires may positively impact performance. Using supply voltage (e.g., Vdd, Gnd) as shielding on certain wires may limit or deter coupling, including for closely spaced wires. In a double-patterned semiconductor device, routing signals on wider wires while connecting shielding to narrower wires may positively impact performance.

Aspects of the disclosure may include a semiconductor device (e.g., chip) having a first conductive layer. The first conductive layer may be multiple-patterned. In an embodiment, first conductive layer may be double-patterned. The first conductive layer may conduct a signal or receive a supply voltage. The first conductive layer may have a first conductive track set or a plurality of first conductive tracks. The first conductive layer may have a second conductive track set or a plurality of second conductive tracks. In embodiments, more conductive layers may exist.

Photolithography steps may involve separate masks to define wire channels for conductive tracks. The separate masks may include a first mask and a second mask. The first conductive track set or the plurality of first conductive tracks may be defined by the first mask. The second conductive track set or the plurality of second conductive tracks may be defined by the second mask. Adjacent or neighboring wire channels may be defined with such separate masks in separate lithography steps. Adjacent or neighboring wire channels may be substantially parallel to one another. In embodiments, the plurality of first conductive tracks may alternate with the plurality of second conductive tracks. In some embodiments, the first and second conductive track sets may be aligned so that first substantially parallel tracks of the first conductive track set alternate with second substantially parallel tracks of the second conductive track set. The first conductive track set is substantially parallel to the second conductive track set when an angular comparison of the first and second conductive track sets is within five percent (e.g., the first conductive track set at an eighty-nine degree angle would be substantially parallel with the second conductive track set at an eighty-seven or a ninety-one degree angle).

In embodiments, a first portion of the first conductive layer may be defined with a first photomask having a first conductive track pattern. A second portion of the first conductive layer may be defined with a second photomask having a second conductive track pattern. The second conductive track pattern may be interdigitated with the first conductive track pattern. In an embodiment, a first pattern with a wire channel may carry a faster wire that may be identified as an "A wire" and a second pattern with a wire channel may carry a slower wire that may be identified as a "B wire." (Faster and slower wires may be associated with an actual or expected RC time constant and may be related to a width of a wire or a wire channel). Wiring channels may alternate in layout for "A wires" and "B wires." Thus, an "A wire" may exist between "B wires" and a "B wire" may exist between "A wires."

Advanced semiconductor process technologies may utilize a dual damascene technique. Aspects of the disclosure may include the first conductive track set or the plurality of first conductive tracks having a first quality characteristic. Aspects of the disclosure may include the second conductive track set or the plurality of second conductive tracks having a second quality characteristic. The first quality characteristic may exceed the second quality characteristic. Examples of the quality characteristic may be a size value, a width, an RC time constant value, or a time for a signal to travel a distance.

Aspects of the disclosure may include the first substantially parallel tracks of the first conductive track set being configured to receive data signals. Aspects of the disclosure may include the second substantially parallel tracks of the second conductive track set being configured to receive the supply voltage. The supply voltage may include a first supply voltage and a second supply voltage. In embodiments, a connection structure may exist. The connection structure may be configured and arranged to allow for selective connection of one of the plurality of first and second conductive tracks to a set of data signals and the other of the plurality of first and second conductive tracks to at least one supply voltage. In embodiments, a repowering block may exist. In embodiments, the connection structure may include the repowering block. In embodiments, a voltage supply grid or a voltage supply track group may exist. In embodiments, the connection structure may include the voltage supply grid or the voltage supply track group.

The width of wire channels (e.g., troughs) for "A wires" and "B wires" may be measured. A first width of a first wire channel for an "A wire" may be the first quality characteristic and a second width of a second wire channel for a "B wire" may be the second quality characteristic. The measurement may occur before etching the wire channels. The measurement may occur before etching the underlying vias. The connections associated with said metal wire may be modified by selecting one of various photomasks for vias. If the first quality characteristic is higher than the second quality characteristic, a first photomask may be selected to connect a supply voltage to a track in the second conductive track pattern and to connect a logic signal to a track in the first conductive track pattern. If the first quality characteristic is not higher than the second quality characteristic, a second photomask may be selected to connect a supply voltage to a track in the first conductive track pattern and to connect a logic signal to a track in the second conductive track pattern. Altogether, aspects of the disclosure may include shielding strategies and embodiments of such shielding strategies. The shielding strategies may reduce at least one of noise and delay sensitivity.

FIG. 1 is a planar view showing a portion of a double-patterned semiconductor device having a non-inverting repowering block and linkages according to embodiments. "A wires" may be generally referred to as 101 wires. "B wires" may be generally referred to as 102 wires. In FIG. 1, for example, conductive tracks carrying "A wires" 101 (shown relatively wide) may be faster than conductive tracks carrying "B wires" 102 (shown relatively narrow). The "A wires" 101 may have a smaller RC time constant than the "B wires" 102. In FIG. 1, for instance, conductive tracks carrying "A wires" 101 may be configured to receive logic or data signals and conductive tracks carrying "B wires" 102 may be configured to receive a supply voltage such as a first and second supply voltage. In embodiments, "B wires" may be faster than "A wires."

The wires may be in segments as shown in FIG. 1. The segments may be termed "North" (N) and "South" (S) for identification purposes. For example, a wire labeled 101N may be an "A wire" in the North segment (in this example, a faster/wider wire in the upper portion of FIG. 1). In embodiments, a conductive track carrying a wire may have a conductive path transferred to another conductive track carrying a wire at a repowering block, linkage, etc. In embodiments, a 101N segment and a 101S segment may form a first conductive path (e.g., for a signal). A 102N segment and a 102S segment may form a second conductive path (e.g., for a supply voltage). In embodiments, a repowering block 140 or a linkage 180 can electrically connect segments (e.g., North segments with South segments) of conductive paths. A repowering block can include various different circuit blocks, such as a repeater block, a buffer block, etc. In certain embodiments, the repowering block may reside on a different substrate layer relative to the linkage 180. The repowering block may include a buffer circuit. In embodiments, the repowering block may be a non-inverting repowering block 140. The non-inverting repowering block may include at least one buffer (for each conductive path) that is a single-input device which produces the state the same as the input. For example, if the input is high then the output is high. A linkage may electrically connect segments of the wires. The linkage may include a conductive material or mechanism. In embodiments, the linkage 180 may be a metal strip. The linkage 180 may be on a different layer than the conductive tracks. The linkage may provide continuity for other aspects such as the conductive path. (Multiple linkages are shown, one linkage such as linkage 180 to connect a North segment to a South segment for each conductive path). The linkage may be connected with the repowering block.

Vias may serve to connect wires and other aspects such as repowering blocks, linkages, voltage supply grid, etc. to provide for conductive paths for signals (e.g., conductive paths associated with "A wires" in embodiments similar to FIG. 1) or shielding (e.g., conductive paths associated with "B wires" in embodiments similar to FIG. 1). A first via 104 may be included as part of a conductive path joining a 101N segment ultimately to a 101S segment. The first via 104 may connect to a linkage 180. The first via 104 may continue through to the repowering block such as non-inverting repowering block 140. (As depicted and described, vias 104 may include vias connected with linkage 180 and North segments regardless of whether associated with "A wires" or "B wires"). A second via 106 and a third via 108 may be programmable vias. Via selection may occur based on quality characteristics of conductive tracks carrying "A wires" 101 and conductive tracks carrying "B wires" 102. In embodiments, the second via 106 may continue through to the repowering block. The second via 106 may connect to the linkage 180 which may result in a conductive path, as in FIG. 1 for example, for segments 102N and 102S (which are narrower "B wires" as depicted). (As depicted and described, vias 106 may include vias connected with linkage 180 and South segments of "B wires"). The third via 108 may connect to the repowering block such as non-inverting repowering block 140 which may result in a conductive path, as in FIG. 1 for example, for segments 101N and 101S (which are wider "A wires" as depicted). (As depicted and described, vias 108 may include vias not connected with linkage 180 but connected with South segments of "A wires").

A voltage supply grid or a voltage supply track group 191, 192 may be configured to carry one or more supply voltages. The voltage supply grid or the voltage supply track group may exist on a separate layer from the conductive tracks. In embodiments, the voltage supply grid or the voltage supply track group may include voltage supply tracks. The voltage supply tracks may include a first voltage supply track 191 and a second voltage supply track 192. The supply voltage may include a first supply voltage (e.g., Gnd) or a second supply voltage (e.g., Vdd). The first voltage supply track 191 may carry the first supply voltage. The second supply voltage track 192 may carry the second supply voltage. Vias 195 may serve to connect wires with the voltage supply grid or the voltage supply track group. The vias 195 may be programmable vias (e.g., programmed to connect a particular supply voltage with a particular conductive track such as a narrower conductive track). Via selection may occur based on quality characteristics of conductive tracks carrying "A wires" 101 and conductive tracks carrying "B wires" 102.

Aspects may provide shielding to noise sensitive signal-carrying wires. Such shielding may positively impact performance. Moreover, routing signals on faster wires while connecting shielding to slower wires may positively impact performance. Such an embodiment may be particularly useful when spacing wires relatively close together (e.g., 14-15 nm technology). In embodiments, the wires, voltage supply grid, linkages, and repowering block may be on four separate layers or some combination of more than one layer.

Figure 2:
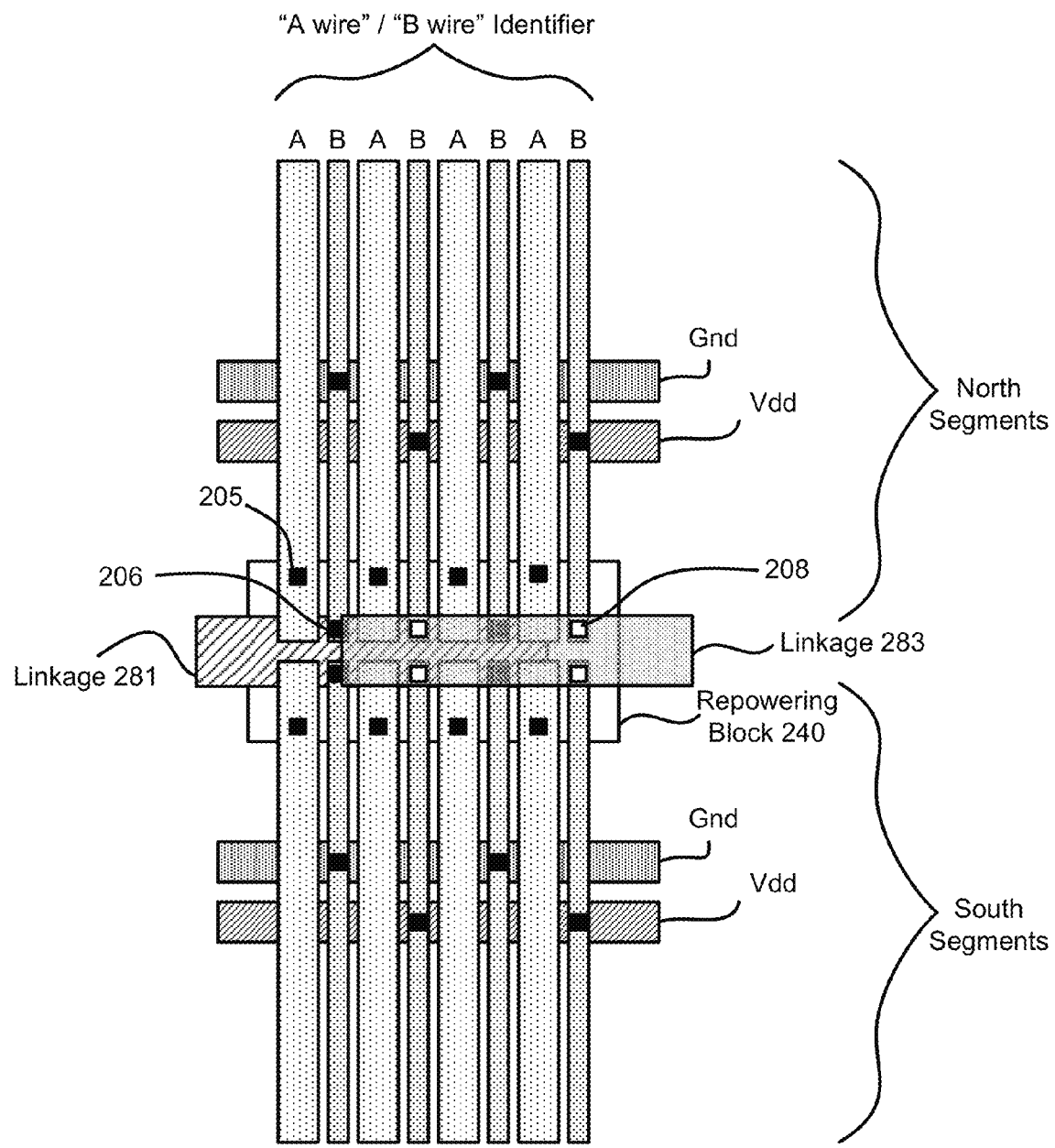
FIG. 2 is a planar view showing a portion of a double-patterned semiconductor device having linkages on different layers according to embodiments.

FIG. 2 is a planar view showing a portion of a double-patterned semiconductor device having linkages on different layers according to embodiments. Aspects of the embodiment depicted in FIG. 2 are similar or the same as related to FIG. 1. Aspects of at least a portion of a connection structure may be distinct from FIG. 1. The connection structure may include a repowering block and a voltage supply grid that are configured and arranged to selectively connect to the plurality of first conductive tracks and the plurality of second conductive tracks. The connection structure may include first vias connecting a repowering block with the one of the plurality of first and second conductive tracks having a greater quality characteristic and second vias connecting a voltage supply grid with the other of the plurality of first and second conductive tracks having a lesser quality characteristic. Linkages may be associated with the connection structure.

Repowering block 240 may repower one or more signals that are carried by conductive tracks. In embodiments, combinations of at least one linkage and at least one repowering block may be considered the connection structure and may further include vias. Linkages 281 and 283 may provide electrical connections between tracks that carry one or more supply voltages. Linkage 283 may provide continuity for the first supply voltage (e.g., Gnd). Linkage 281 may provide continuity for the second supply voltage (e.g., Vdd). In embodiments, vias 205, 206, and 208 may be programmable. Vias 205 may connect conductive tracks for faster wires to the repowering block 240 (e.g., faster wires associated with carrying a signal). Vias 208 may connect conductive tracks for first selected slower wires (e.g., slower wires associated with Gnd) to linkage 283. Vias 206 may connect conductive tracks for second selected slower wires (e.g., slower wires associated with Vdd) to linkage 281.

Linkages 281 and 283 may exist on different layers. Linkages 281 and 283 may exist on layers distinct from the layer having the conductive tracks. Linkages 281 and 283 may be adapted to electrically connect separate of portions of the first and second conductive track sets. In embodiments, a second conductive layer having a first linkage may be adapted to electrically connect at least a first portion of the first conductive track set with at least a second portion of the first conductive track set or at least a first portion of the second conductive track set with at least a second portion of the second conductive track set. In furtherance of that example, a third conductive layer having a second linkage may be adapted to electrically connect at least a third portion of the first conductive track set with at least a fourth portion of the first conductive track set or at least a third portion of the second conductive track set with at least a fourth portion of the second conductive track set.

Figure 3:
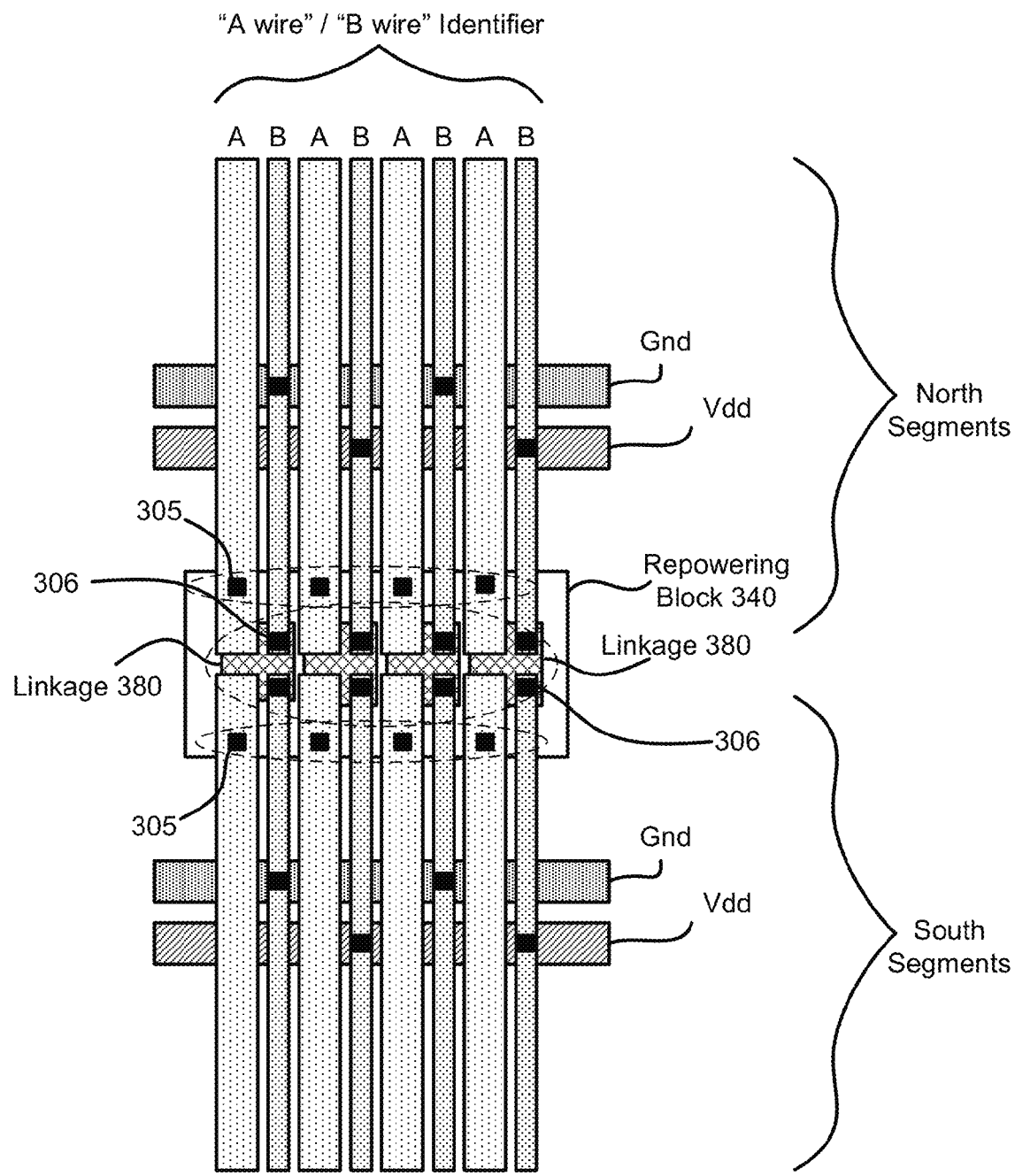
FIG. 3 is a planar view showing a portion of a double-patterned semiconductor device having linkages on a layer across multiple wire channels according to embodiments.

FIG. 3 is a planar view showing a portion of a double-patterned semiconductor device having linkages on a layer across multiple wire channels according to embodiments. Aspects of the embodiments depicted in FIG. 3 are similar or the same as related to FIGS. 1-2. Aspects such as repowering blocks and linkages may be distinct from FIGS. 1-2. Repowering block 340 may repower a signal. Vias 305 may connect conductive tracks for faster wires to the repowering block 340. Linkages 380 may provide electrical connections for supply voltage with vias 306 for continuity of slower wires. Vias 305 and 306 may be programmable (e.g., may be arranged so as to form the connections described).

Figure 4:
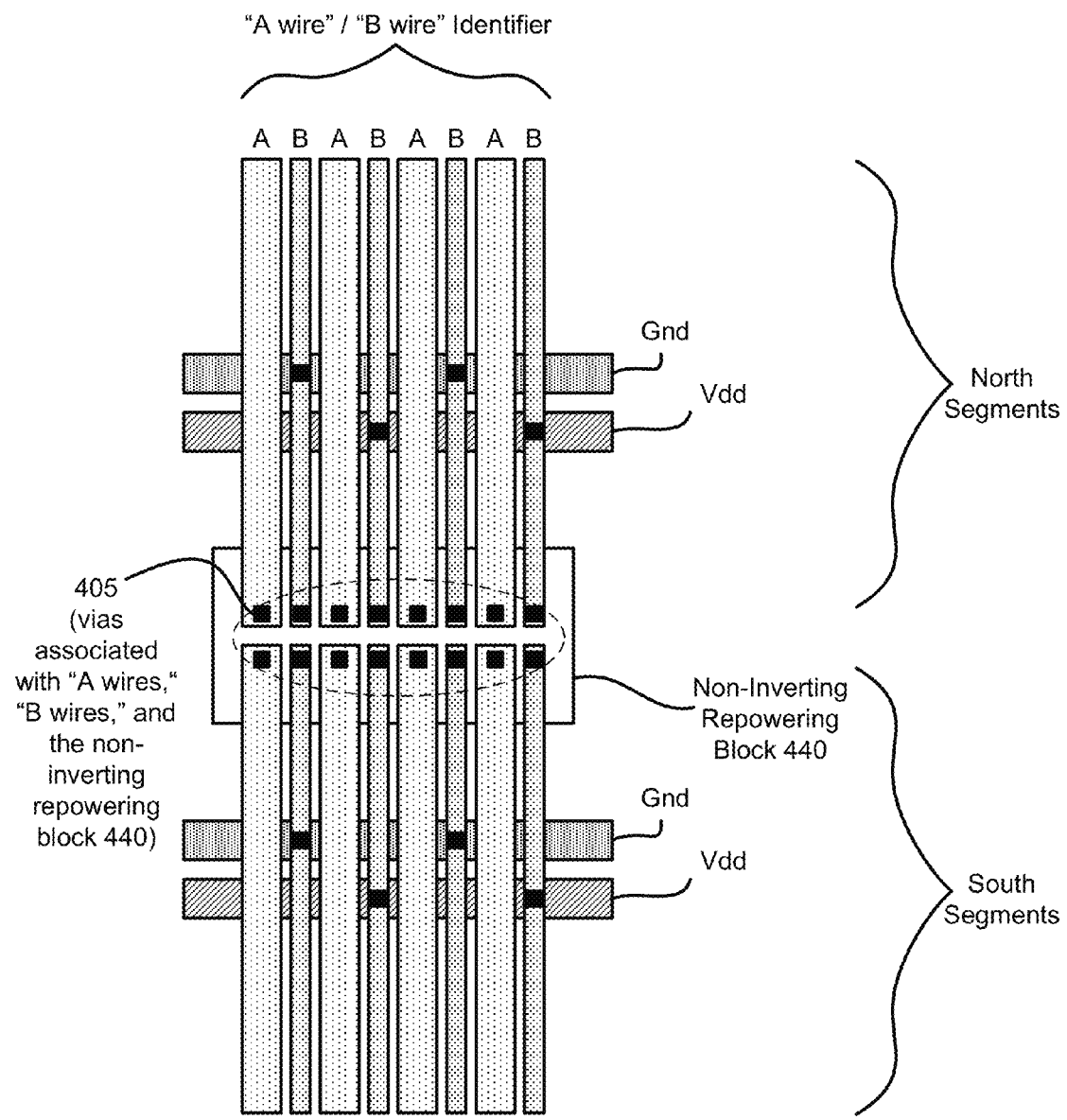
FIG. 4 is a planar view showing a portion of a double-patterned semiconductor device having a non-inverting repowering block according to embodiments.

FIG. 4 is a planar view showing a portion of a double-patterned semiconductor device having a non-inverting repowering block according to embodiments. Aspects of the embodiment depicted in FIG. 4 are similar or the same as related to FIGS. 1-3. A non-inverting repowering block 440 may repower a signal. Vias 405 may connect conductive tracks to the repowering block 440. Vias 405 may be predetermined (i.e., non-programmable). Predetermined vias may allow for fewer processing steps than with programmable vias. Shielding aspects may have continuous polarity through the non-inverting repowering block 440.

Figure 5:
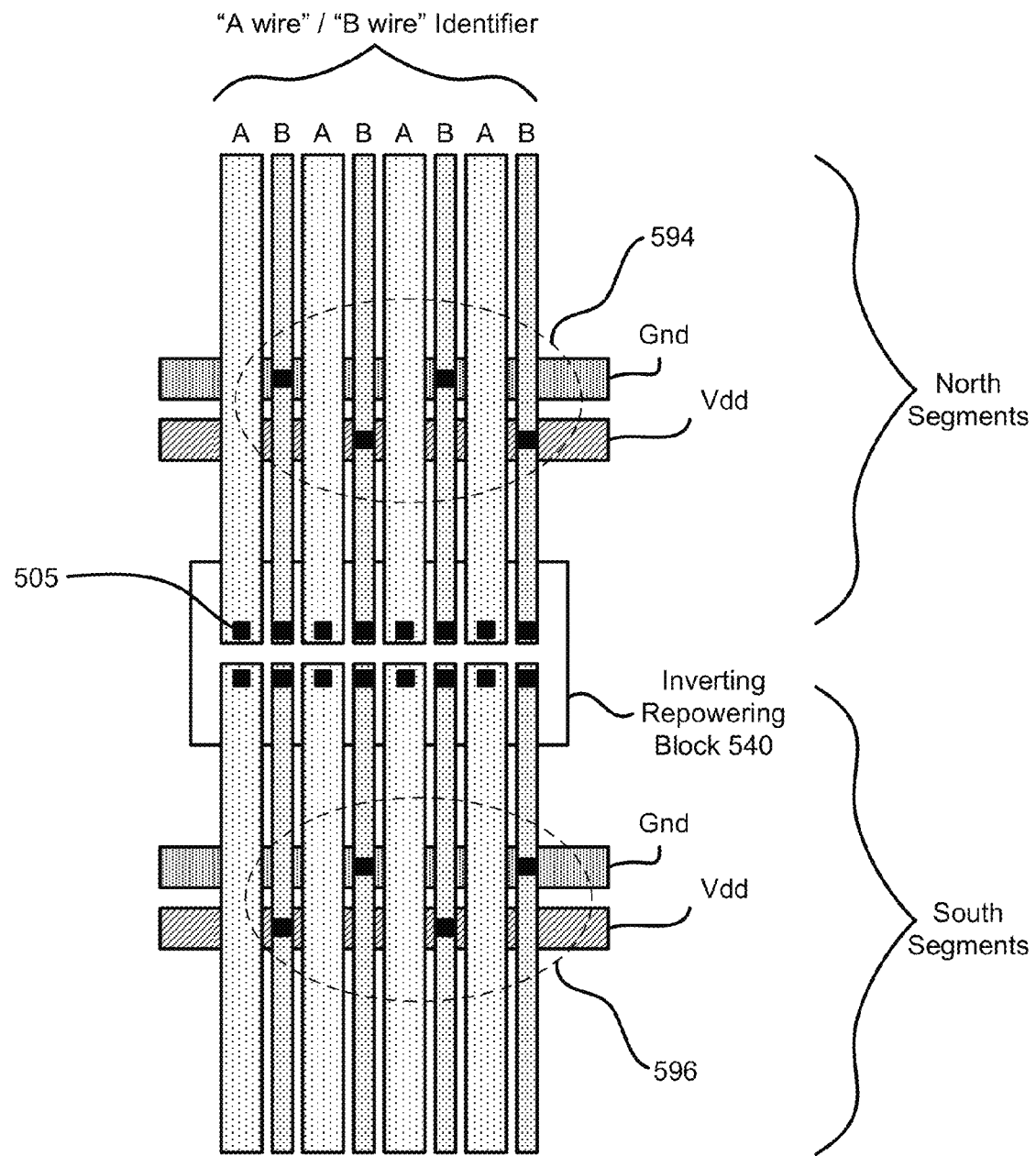
FIG. 5 is a planar view showing a portion of a double-patterned semiconductor device having an inverting repowering block according to embodiments.

FIG. 5 is a planar view showing a portion of a double-patterned semiconductor device having an inverting repowering block according to embodiments. Aspects of the embodiment depicted in FIG. 5 are similar or the same as related to FIGS. 1-4. An inverting repowering block 540 may repower a signal. The inverting repowering block may include at least one buffer (for each conductive path) that is a single-input device which produces the state the opposite as the input. For example, if the input is high then the output is low. Vias 505 (similar or the same as vias 405 described regarding FIG. 4) may connect conductive tracks to the repowering block 540. Vias 505 may be predetermined. Vias 594 and 596 may be programmable. Vias 594 and 596 may be used for slower "B wires." Shielding aspects may alternate polarity (e.g., change polarity, switch polarity) through the inverting repowering block 540. As arranged in FIG. 5, vias 594 and 596 may be arranged in relation to given supply voltages to also switch delivery of supply voltages at each via connection relative to the previous via connection. For example, a conductive path associated with Gnd supply voltage as related to vias 594 may be associated with Vdd supply voltage as related to vias 596.

Figure 6:
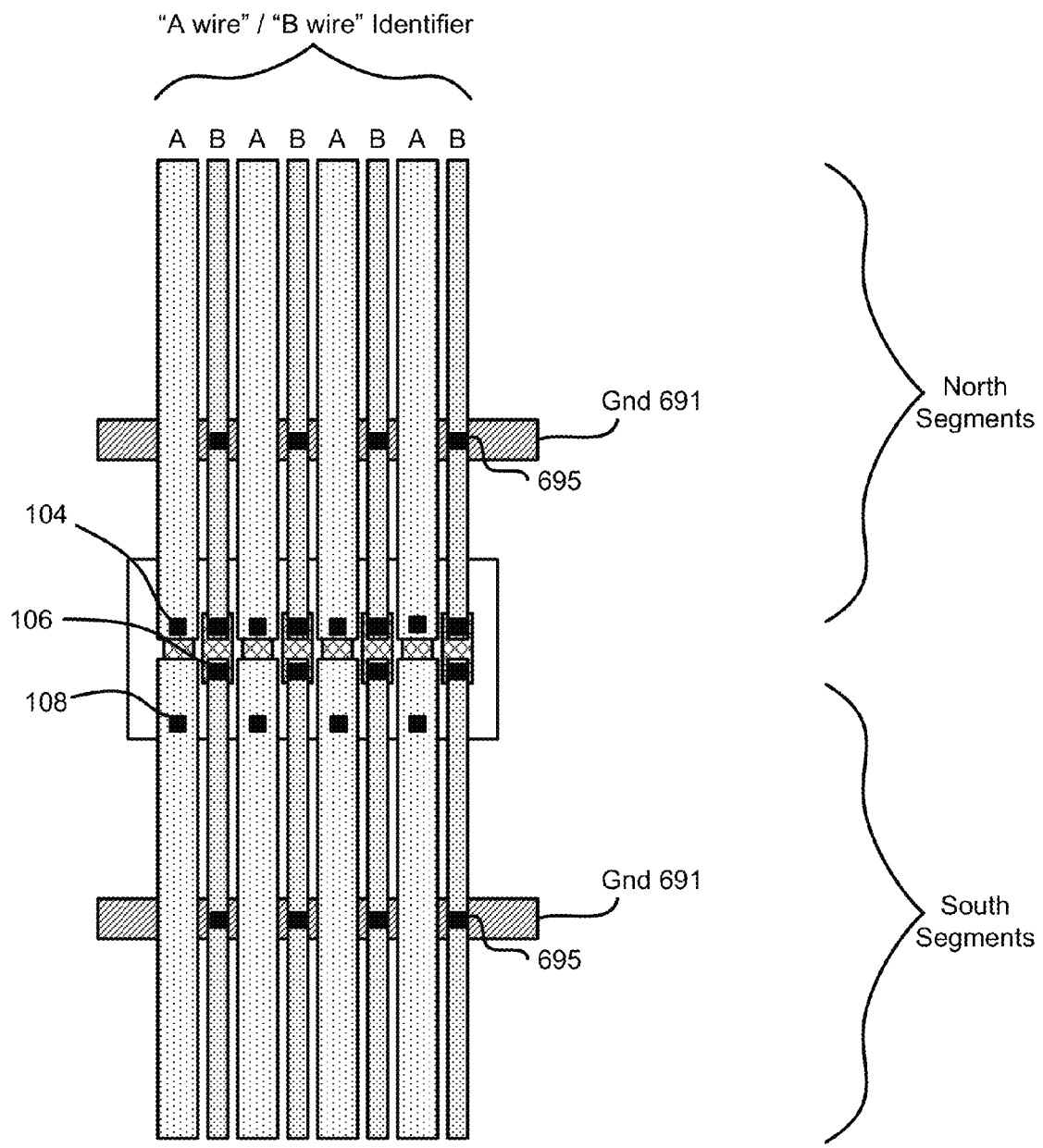
FIG. 6 is a planar view showing a portion of a double-patterned semiconductor device with one voltage for the supply voltage according to embodiments.

FIG. 6 is a planar view showing a portion of a double-patterned semiconductor device with one voltage for the supply voltage according to embodiments. Aspects of the embodiment depicted in FIG. 6 are similar or the same as related to FIGS. 1-5 and in particular FIG. 1. In an embodiment, the first supply voltage and the second supply voltage may be a same voltage. A voltage supply track 691 may carry the same voltage (e.g., Gnd). Vias 695 may serve to connect wires with the voltage supply grid or the voltage supply track group. The vias 695 may be programmable vias. Via selection may occur based on quality characteristics of conductive tracks carrying "A wires" 101 and conductive tracks carrying "B wires" 102. Shielding aspects may be associated wires having the lesser quality characteristic. Other embodiments are contemplated related to a variety of layers, voltage supply grids, connection structures, linkages, via placement, repowering blocks, etc.

Figure 7A:
FIG. 7A is a cross-sectional view of a semiconductor device pre-exposure to a first mask and pre-exposure to a second mask according to embodiments.
Figure 7A:
Figure 7A:
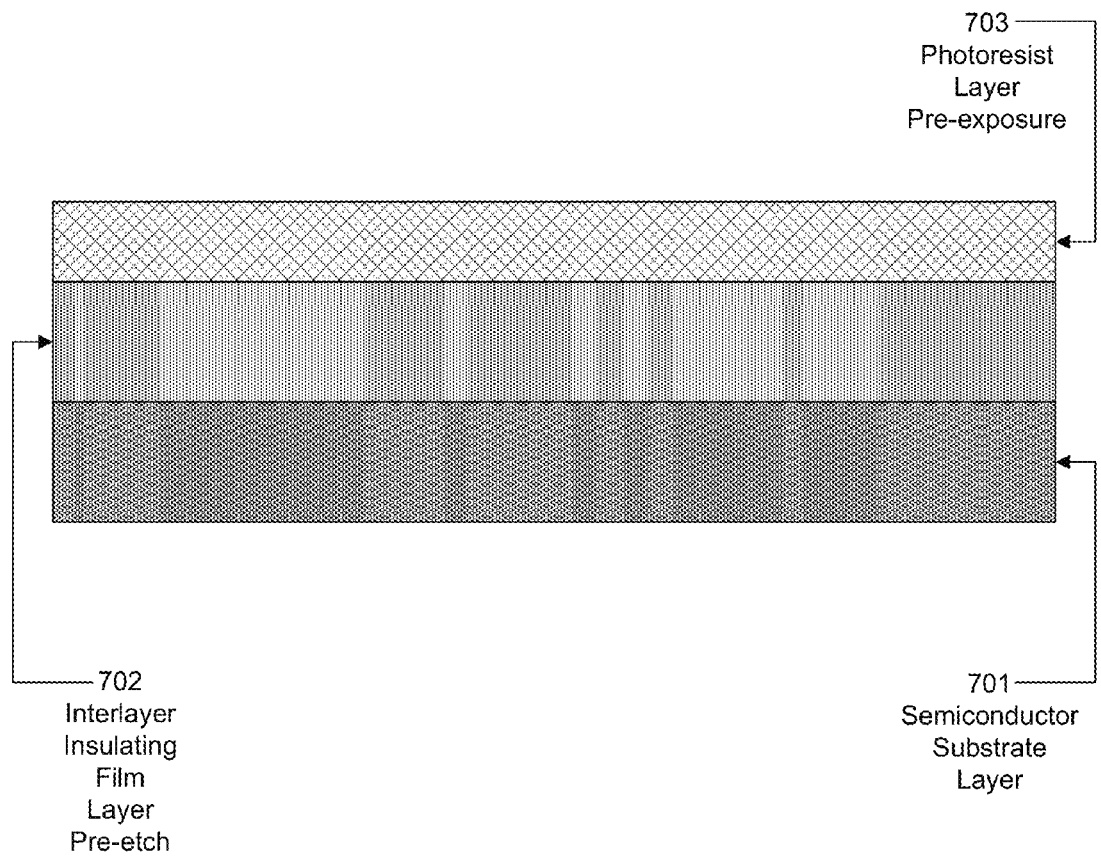

FIG. 7A is a cross-sectional view of a semiconductor device pre-exposure to a first mask and pre-exposure to a second mask pursuant to the disclosure. To form a semiconductor device, an interlayer insulating film pre-etch 702 may be formed on a semiconductor substrate 701 in which various components are to be formed. A photoresist 703 may then be coated on the interlayer insulating film pre-etch 702. Advanced semiconductor process technologies may utilize a dual damascene technique. A first mask 711 may be used to define a first wire channel and a second mask 722 may be used to define a second wire channel.

Figure 7B:
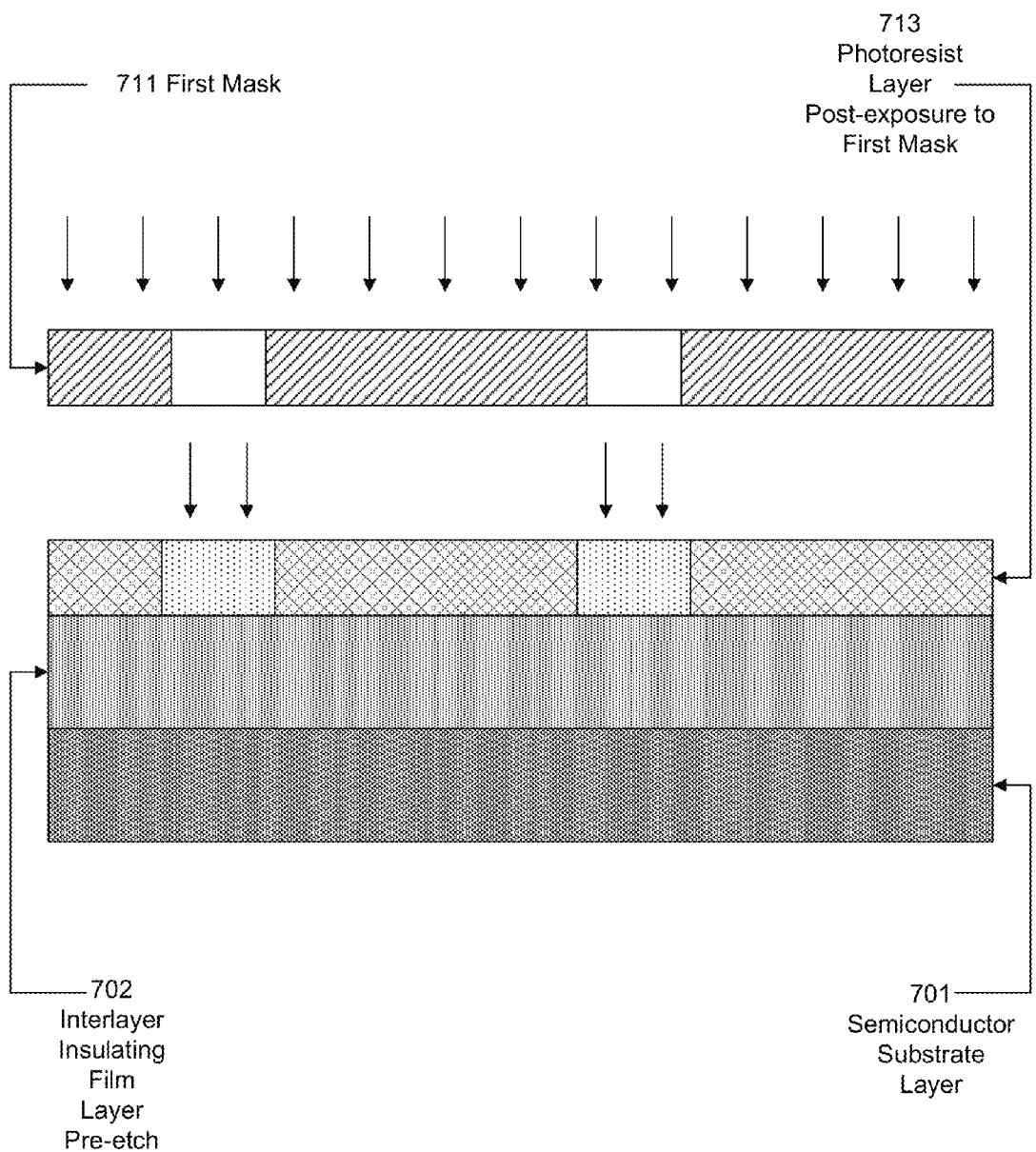
FIG. 7B is a cross-sectional view of a semiconductor device post-exposure to the first mask and pre-exposure to the second mask according to embodiments.

FIG. 7B is a cross-sectional view of a semiconductor device post-exposure to the first mask and pre-exposure to the second mask pursuant to the disclosure. The first mask 711 may define the first wire channel on the photoresist 703 through exposure. A photoresist 713 post-exposure to the first mask may have the first wire channel defined.

Figure 7C:
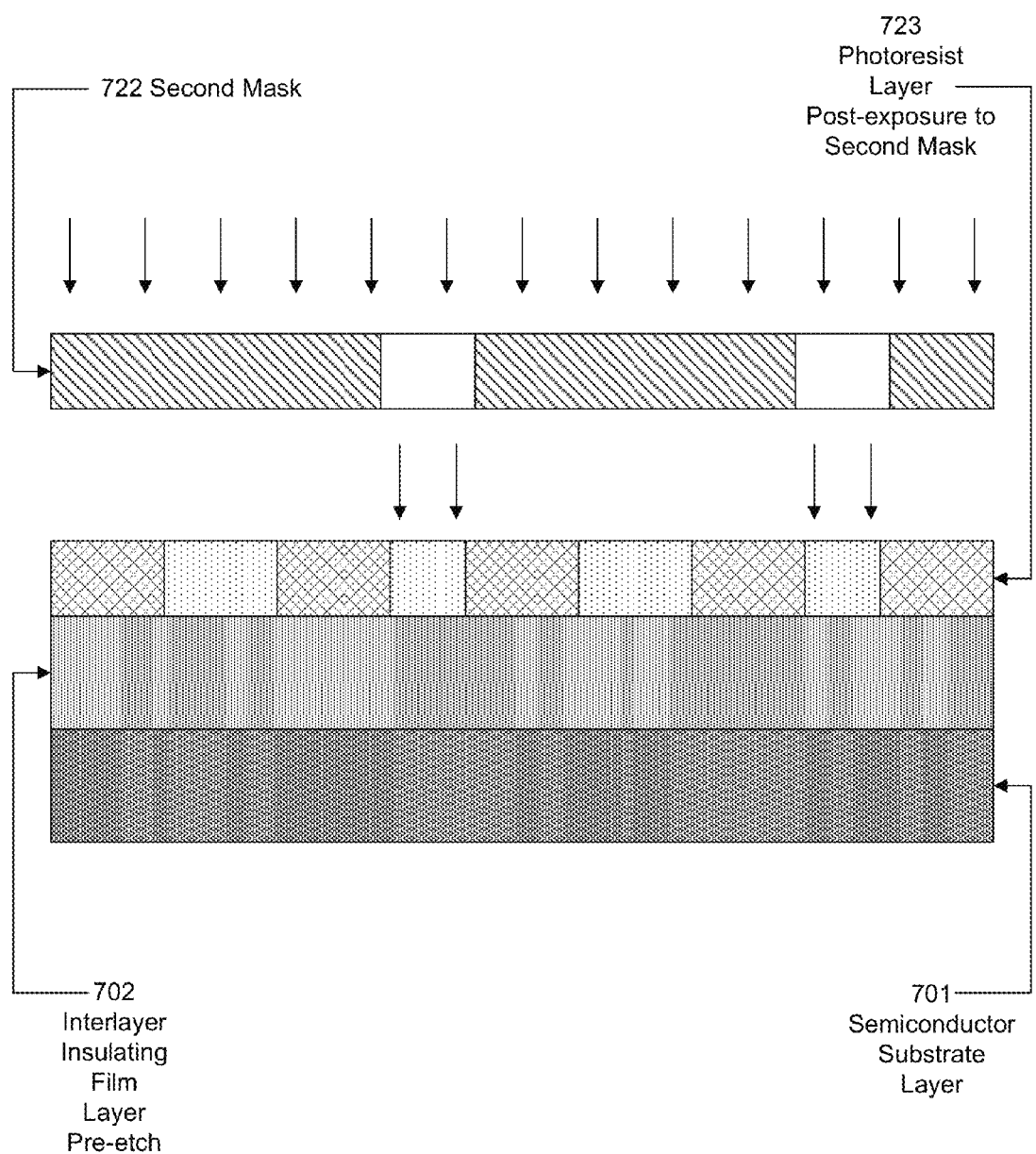
FIG. 7C is a cross-sectional view of a semiconductor device post-exposure to both the first mask and to the second mask according to embodiments.

FIG. 7C is a cross-sectional view of a semiconductor device post-exposure to both the first mask and to the second mask pursuant to the disclosure. The second mask 722 may define the second wire channel on the photoresist 713 through exposure. A photoresist 723 post-exposure to the second mask may have the second wire channel defined.

Figure 7D:
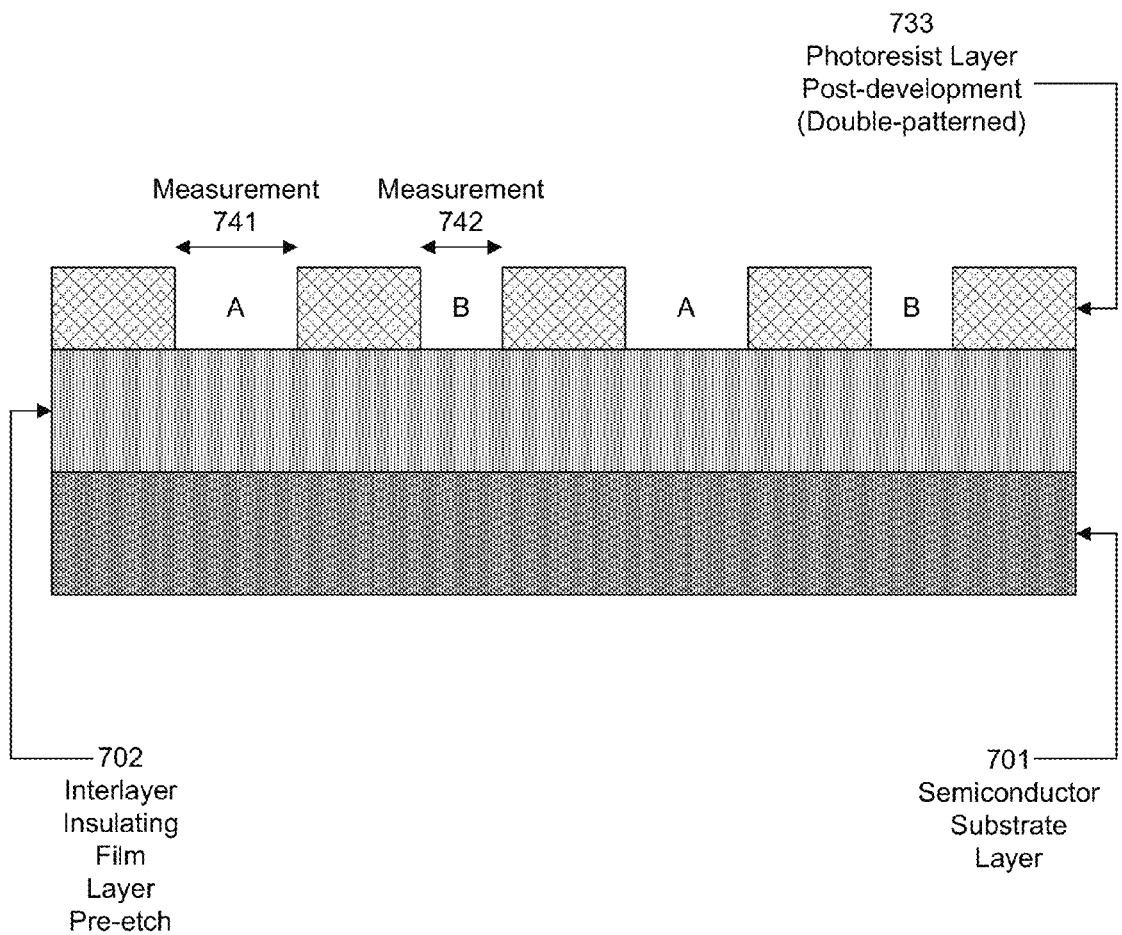
FIG. 7D is a cross-sectional view of a semiconductor device post-development according to embodiments.

FIG. 7D is a cross-sectional view of a semiconductor device post-development pursuant to the disclosure. A photoresist 733 post-development may have both the first and second wire channels or outlines for wire channels ready to be measured. The width of the wire channels or outlines for wire channels for "A wires" and "B wires" may be measured with respect to the photoresist 733. The measurement may occur after the photoresist has been developed or processed. Processing may include removing portions of the photoresist that were exposed. The measurement may occur before etching the wire channels using outlines for wire channels. The measurement may occur before etching the underlying vias. Via locations may be decided before etching. The dominate variable of the variation in widths (of the wire channels or outlines for wire channels) may be due to the exposure. For example, the photoresist area of one set of wire channels may have been exposed to light for a different amount of time than the photoresist area of another set. Other factors such as the intensity of the exposure or angle of the light may also have an impact. Thus, widths may be generally consistent within corresponding sets of wire channels in the two-step process, but may have different widths when compared to wire channels exposed during a different step. In FIG. 7D, for example, channels developed for "A wires" with a first width 741 may be faster than channels developed for "B wires" with a second width 742 because the first width 741 may be greater than the second width 742. In embodiments, measuring only the first and second widths 741, 742 may produce a satisfactory result.

In some embodiments, after etching the first and second wire channels, measurement may occur again before etching the underlying vias.

Figure 7E:
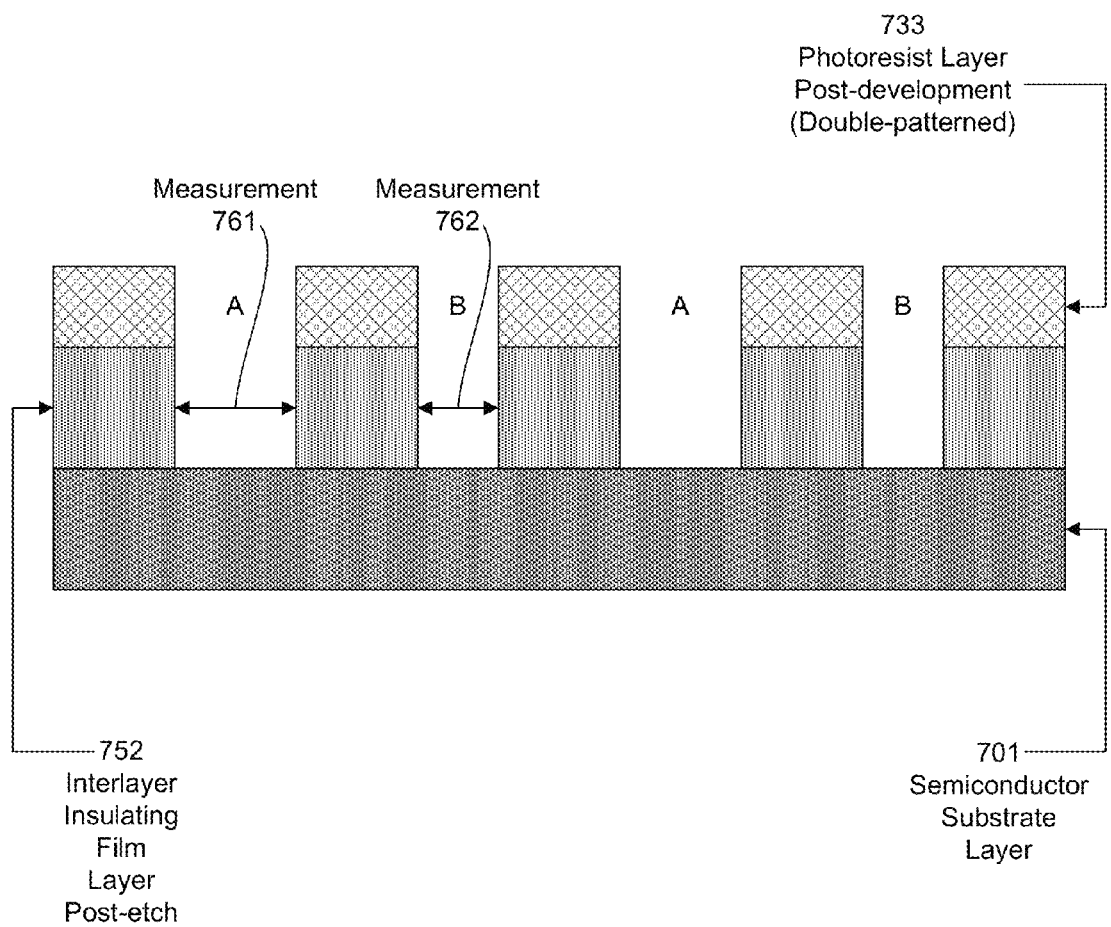
FIG. 7E is a cross-sectional view of a semiconductor device post-etch pursuant to the disclosure.

FIG. 7E is a cross-sectional view of a semiconductor device post-etch pursuant to the disclosure. In embodiments, wire channels may include a portion of an interlayer insulating film layer post-etch 752. The interlayer insulating film layer post-etch 752 may have both the first and second wire channels ready to be measured. The width of the wire channels for "A wires" and "B wires" may be measured with respect to the interlayer insulating film layer post-etch 752. The measurement may occur after etching the wire channels. In FIG. 7E, for example, channels etched for "A wires" with a third width 761 may be faster than channels etched for "B wires" with a fourth width 762 because the third width 761 may be greater than the fourth width 762. In embodiments, measuring only the third and fourth widths 761, 762 may produce a satisfactory result. In embodiments, at least widths 741, 742, 761, 762 may be measured. Measuring at least widths 741, 742, 761, 762 (e.g., measuring both pre-etch and post-etch) may produce a satisfactory result. Other width measurement combinations are considered and may be taken in embodiments. Such width measurements may be taken at different stages, including those described related to FIGS. 7D-7E.

Figure 8:
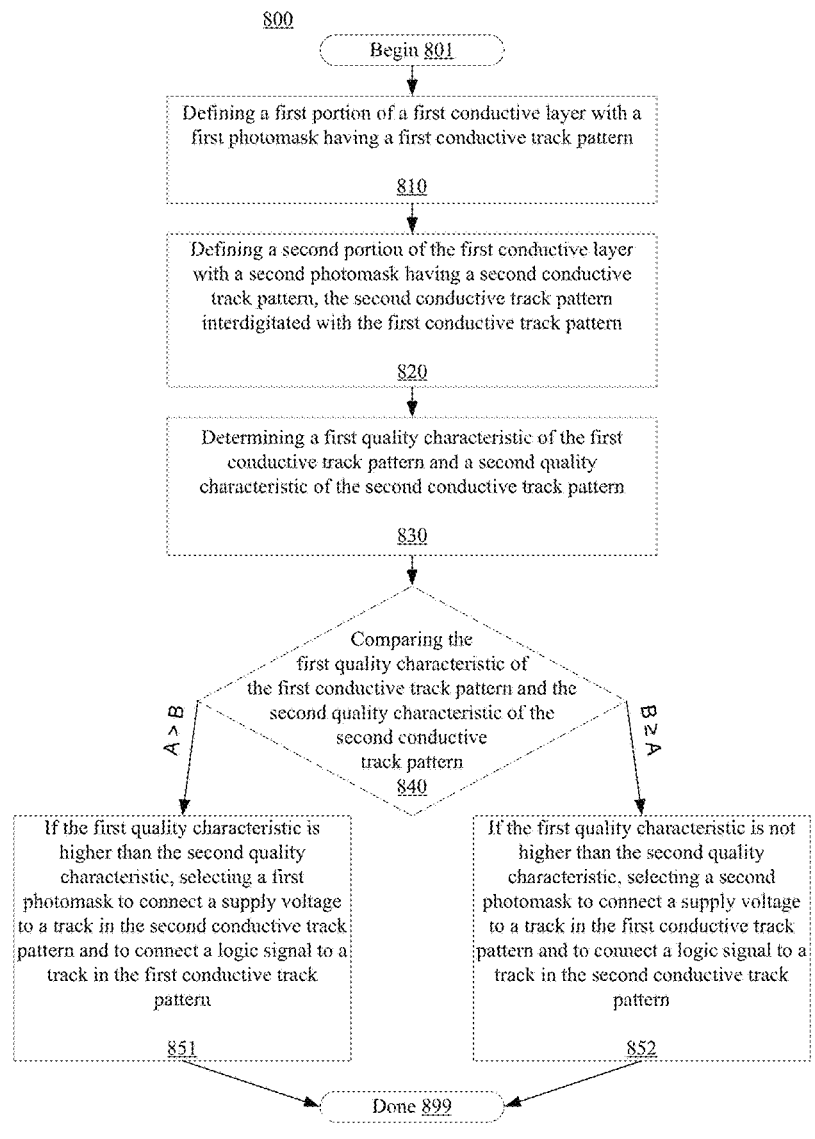
FIG. 8 is a flow chart showing a method of manufacturing a semiconductor device according to embodiments.

FIG. 8 is a flow chart showing a method 800 of manufacturing a semiconductor device according to embodiments. The method 800 of manufacturing a semiconductor device may begin at block 801. A first portion of a first conductive layer may be defined at block 810. A first photomask may define the first portion of the first conductive layer. The first photomask may have a first conductive track pattern. A second portion of the first conductive layer may be defined at block 820. A second photomask may define the second portion of the first conductive layer. The second photomask may have a second conductive track pattern. The second conductive track pattern may be interdigitated with the first conductive track pattern. Interdigitating may include, for example, meshing or intertwining. In an embodiment, interdigitating the first and second conductive track patterns may produce substantially parallel conductive tracks. The first and second conductive track patterns may be considered substantially parallel if an angular comparison of tracks of the first and second conductive track patterns is within five percent. The defining operations of blocks 810 and 820 may produce wire channels or outlines for wire channels determined by the first and second photomasks giving rise to what may be termed "A wires" and "B wires."

A first quality characteristic of the first conductive track pattern and a second quality characteristic of the second conductive track pattern may be determined at block 830. Determining the first and second quality characteristics may include measuring wire channels or outlines for wire channels determined by masks for "A wires" and "B wires." Measuring may include a measurement of the width of a wire channel (e.g., trench, trough). The measurement may be performed before a via etch. The measurement may be performed before via or conductor (e.g., metal) depositions. In embodiments, the first and second conductive track patterns may include first and second wire channels (including first and second wire channels post-etch) or first and second outlines for wire channels. Other possibilities are considered such as determining an RC product or similar characteristics.

The first quality characteristic of the first conductive track pattern and the second quality characteristic of the second conductive track pattern may be compared at block 840. Measurement values from block 830 may be used to compare channels created by masks for "A wires" and "B wires." The largest measurement value from block 830 of the width of a trench or trough may be considered faster. The smallest measurement value from block 830 of the width of a trench or trough may be considered slower. Thus, a channel with a larger width may be faster than a channel with a smaller width.

In embodiments, photomasks (e.g., via masks) may be chosen based on a comparison of channels. Via etching may occur in accordance with embodiments as described in the discussion related to FIGS. 1-7E. If the first quality characteristic is higher than (e.g., greater than, exceeds) the second quality characteristic, a first photomask to connect a supply voltage to a track in the second conductive track pattern and to connect a logic signal to a track in the first conductive track pattern is selected at block 851. If the first quality characteristic is not higher than the second quality characteristic, a second photomask to connect a supply voltage to a track in the first conductive track pattern and to connect a logic signal to a track in the second conductive track pattern is selected at block 852. In embodiments, etching vias may occur to provide for a conductive path connecting supply voltage with at least one of the first and second conductive track patterns.

In embodiments, at least one second conductive layer may be established. In embodiments, the second conductive layer may have at least one voltage supply track. The voltage supply track may be adapted to deliver at least one supply voltage. In embodiments, the second conductive layer may at least one linkage. The linkage may be adapted to electrically connect portions of the conductive track patterns. The linkage may be configured to provide continuity for a conductive path.

Aspects of the disclosure may provide shielding to noise sensitive signal-carrying wires. Such shielding may positively impact performance. Furthermore, in a double-patterned semiconductor device, routing signals on wider wires while connecting shielding to narrower wires may positively impact performance. In addition to embodiments described above, other embodiments having fewer operational steps, more operational steps, or different operational steps are contemplated. Also, some embodiments may perform some or all of the above operational steps in a different order.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

While the foregoing is directed to exemplary embodiments, other and further embodiments of the disclosure may be devised without departing from the basic scope thereof, and the scope thereof is determined by the claims that follow.

What is claimed is:

1. A method of manufacturing a semiconductor device, comprising:

defining a first portion of a first conductive layer with a first photomask having a first conductive track pattern;

defining a second portion of the first conductive layer with a second photomask having a second conductive track pattern, the second conductive track pattern interdigitated with the first conductive track pattern;

determining a first quality characteristic of the first conductive track pattern and a second quality characteristic of the second conductive track pattern;

comparing the first quality characteristic of the first conductive track pattern and the second quality characteristic of the second conductive track pattern; and selecting, in response to comparing the first quality characteristic and the second quality characteristic, a first photomask in response to determining the first quality characteristic is higher than the second quality characteristic, the first photomask configured to connect a supply voltage to a track in the second conductive track pattern and to connect a logic signal to a track in the first conductive track pattern; and a second photomask in response to determining the first quality characteristic is not higher than the second quality characteristic, the second photomask configured to connect a supply voltage to a track in the first conductive track pattern and to connect a logic signal to a track in the second conductive track pattern.

2. The method of claim 1, wherein the first quality characteristic of the first conductive track pattern is a first measurement for a first width of a first wire channel and the second quality characteristic of the second conductive track pattern is a second measurement for a second width of a second wire channel.

3. The method of claim 2, wherein at least one of the first and second measurements occurs after at least one of developing a photoresist, processing a photoresist, outlining the first and second wire channels, and etching the first and second wire channels.

4. The method of claim 1, wherein selecting the photomask provides shielding which reduces at least one of noise and delay sensitivity.

5. The method of claim 1, further comprising etching vias to provide for a conductive path connecting supply voltage with at least one of the first and second conductive track patterns.

6. The method of claim 1, further comprising establishing at least one second conductive layer having at least one voltage supply track adapted to deliver the at least one supply voltage.

7. The method of claim 1, further comprising establishing at least one second conductive layer having at least one linkage adapted to electrically connect at least one of:

at least one first portion of the first conductive track pattern with at least one second portion of the first conductive track pattern; and at least one first portion of the second conductive track pattern with at least one second portion of the second conductive track pattern.

\* \* \* \* \*